United States Patent
Herman (10) Patent No.: US 10,484,666 B1
(45) Date of Patent: Nov. 19, 2019

(54) METHOD AND APPARATUS FOR A COMPUTER VISION CAMERA UNIT

(71) Applicant: Edge Robotics Inc., Pittsburgh, PA (US)

(72) Inventor: Herman Herman, Pittsburgh, PA (US)

(73) Assignee: Herman Herman, Pittsburgh, PA (US)

( * ) Notice: Subject to any disclaimer, the term of this patent is extended or adjusted under 35 U.S.C. 154(b) by 0 days.

(21) Appl. No.: 15/462,707

(22) Filed: Mar. 17, 2017

Related U.S. Application Data (60) Provisional application No. 62/309,677, filed on Mar. 17, 2016.

(51) Int. Cl.
| | |
|---|---|
| H04N 13/02 | (2006.01) |
| G06T 9/00 | (2006.01) |
| H01L 27/146 | (2006.01) |
| G06T 7/00 | (2017.01) |
| H04N 13/25 | (2018.01) |
| H04N 5/222 | (2006.01) |
| G06K 9/00 | (2006.01) |
| G06T 7/80 | (2017.01) |
| H04N 13/246 | (2018.01) |
| H04N 13/271 | (2018.01) |

(52) U.S. Cl.
CPC ......... *H04N 13/25* (2018.05); *G06K 9/00664* (2013.01); *G06T 7/80* (2017.01); *H01L 27/14601* (2013.01); *H04N 5/2226* (2013.01); *H04N 13/246* (2018.05); *H04N 13/271* (2018.05)

(58) Field of Classification Search
None
See application file for complete search history.

(56) References Cited

U.S. PATENT DOCUMENTS

| | | | |
|---|---|---|---|
| 6,392,688 B1 * | 5/2002 | Barman | H04N 13/0239 348/125 |
| 7,667,198 B2 * | 2/2010 | Strandemar | H04N 5/33 250/330 |
| 9,589,384 B1 | 3/2017 | Waggoner | |
| 2014/0118257 A1 | 5/2014 | Baldwin | |
| 2014/0139642 A1 * | 5/2014 | Ni | H04N 9/09 348/48 |
| 2014/0330078 A1 * | 11/2014 | Hwang | A61B 1/00193 600/111 |

(Continued)

*Primary Examiner* — William B Perkey
(74) *Attorney, Agent, or Firm* — Kaplan IP Law, PLLC; Jonathan T. Kaplan (57) ABSTRACT

A computer vision camera unit comprising first and second pairs, of image capture assemblies, both of which have an approximately same orientation to a first axis. The first and second pairs are optically focused to capture first and second fields of view that, at least, overlap each other. Providing the first and second pairs with imager chips of differing light sensitivity permits high dynamic range to be realized. Having the second field of view within the first field of view permits specialization, between the first and second pairs, similar to the roles of peripheral and foveal vision, found in biological stereo vision systems. The image capture assemblies can be organized in a rectangular configuration that implies third and fourth pairs, orthogonal to the first and second pairs. The orthogonal but interlocking nature, of the first and second pairs in relation to the third and fourth pairs, enables an autocalibration technique.

12 Claims, 11 Drawing Sheets

(56) References Cited

U.S. PATENT DOCUMENTS

| | | | |
|---|---|---|---|
| 2015/0312445 A1* | 10/2015 | Cha | H04N 5/2226 |
| | | | 348/48 |
| 2015/0350542 A1* | 12/2015 | Steuart, III | G03B 35/08 |
| | | | 348/36 |
| 2016/0100154 A1* | 4/2016 | Ghyme | H04N 13/0242 |
| | | | 348/48 |
| 2016/0198146 A1* | 7/2016 | Hayasaka | G06T 1/20 |
| | | | 348/48 |
| 2016/0205380 A1* | 7/2016 | Inoue | G06T 7/73 |
| | | | 348/46 |
| 2016/0239978 A1* | 8/2016 | Cole | G06T 7/593 |
| 2017/0064282 A1* | 3/2017 | Lo | H04N 13/0404 |
| 2017/0134713 A1* | 5/2017 | Lin | H04N 13/0246 |
| 2017/0171465 A1* | 6/2017 | Chen | H04N 5/23232 |
| 2017/0178379 A1* | 6/2017 | Fu | G06T 7/80 |
| 2017/0223340 A1 | 8/2017 | Salvagnini et al. | |

\* cited by examiner

Pseudocode for auto alignment

- $(Xf_i, Yf_i)$ location of the common feature visible in all the images that is used for the auto alignment. For a quad imager configuration, there will be 4 coordinates $(Xf_1, Yf_1), (Xf_2, Yf_2), (Xf_3, Yf_3)$ and $(Xf_4, Yf_4)$ 1. Vertical misalignment $(1,2) = Yf_1 - Yf_2 \rightarrow$ should be zero if the imagers are well calibrated
2. Vertical misalignment $(3,4) = Yf_3 - Yf_4 \rightarrow$ should be zero if the imagers are well calibrated
3. Horizontal misalignment $(1,3) = Xf_1 - Xf_3$
4. Horizontal misalignment $(2,4) = Xf_2 - Xf_4$
5. Horizontal disparity average = $(|Xf_1 - Xf_2| + |Xf_3 - Xf_4|) / 2$
6. Vertical disparity average = $(|Yf_1 - Yf_3| + |Yf_2 - Yf_4|) / 2$
7. Convert the horizontal disparity and vertical disparity averages into geometric distance using the stereo formula (reference article such as http://www.techbriefs.com/component/content/article/ntb/features/feature-articles/14925 for the stereo formula) and call this the Average distance (Ad)

FIGURE 11B

Pseudocode for auto alignment

8. Compute the new principal point (Xni,Yni) for imager I, which results in zero vertical and horizontal misalignment (line 1 – 4), while also minimizing the total euclidean distance between the original principal point (Xci,Yci) and the new principal point (Xni,Yni) summed over all the imagers (Figure 10B) -> the goal is to find the smallest optical movement that will align the imagers. This process will be done through an optimization method 9. Another constraint that will be enforced during the optimization method is that the horizontal disparities average and the vertical disparity average (as computed in line 5 and 6 after the image is shifted by the distance between the calibrated principal point and the new principal point) must translate to the same geometric distance to the reference feature.

10. The optimization computed in #8 with the constraint #9 can be done using various algorithms, including brute force iterative method.

METHOD AND APPARATUS FOR A COMPUTER VISION CAMERA UNIT

As provided for under 35 U.S.C. § 119(e), this patent claims benefit of the filing date for the following U.S. provisional patent application, herein incorporated by reference in its entirety:

"Method and Apparatus for a Computer Vision Camera Unit," filed 2016 Mar. 17 (y/m/d), having inventor Herman Herman and App. No. 62/309,677.

FIELD OF THE INVENTION

The present invention relates generally to computer vision, and, more particularly, to a computer vision camera unit.

BACKGROUND OF THE INVENTION

Known computer vision systems, particularly those that offer stereo vision, are extremely complex and fragile.

For example, from the perspective of their mechanical construction, maintaining the alignment of the optical hardware is extremely difficult and expensive.

As another example, maintaining the integrity of high speed cabling and connectors is extremely difficult and expensive.

This is particularly true for computer vision (or "CV") systems subject to frequent mechanical disturbances (e.g., shocks, vibration, or both). Environments subject to such disturbances often also include temperature variation as an additional complication. Environments with these types of complications occur, for example, when CV systems are deployed on mobile platforms (such as autonomous, or semi-autonomous, vehicles).

This is unfortunate since, with respect to just information processing hardware itself, the cost of rugged systems has decreased dramatically in recent years. For example, currently-available smartphones are, in effect, rugged and inexpensive computer systems that also offer an ability to make telephone calls. If the additional vulnerabilities of CV systems can be addressed in an inexpensive way, the widespread use of such systems, with their concomitant benefit to society, can soon be expected.

Accordingly there is a need for powerful and versatile CV systems, that are still rugged and inexpensive.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION

Reference will now be made in detail to various embodiments of the invention, examples of which are illustrated in the accompanying drawings. Wherever possible, the same reference numbers will be used throughout the drawings to refer to the same or like parts.

Please refer to the section titled "Glossary of Selected Terms," for the definition of selected terms used below.

TABLE OF CONTENTS TO DETAILED DESCRIPTION

1 Mechanical Construction
2 Automatic Alignment
3 Foveal and Peripheral Vision Emulation
4 Versatility
5 Glossary of Selected Terms

1 Mechanical Construction

Figures 1A, 1B:
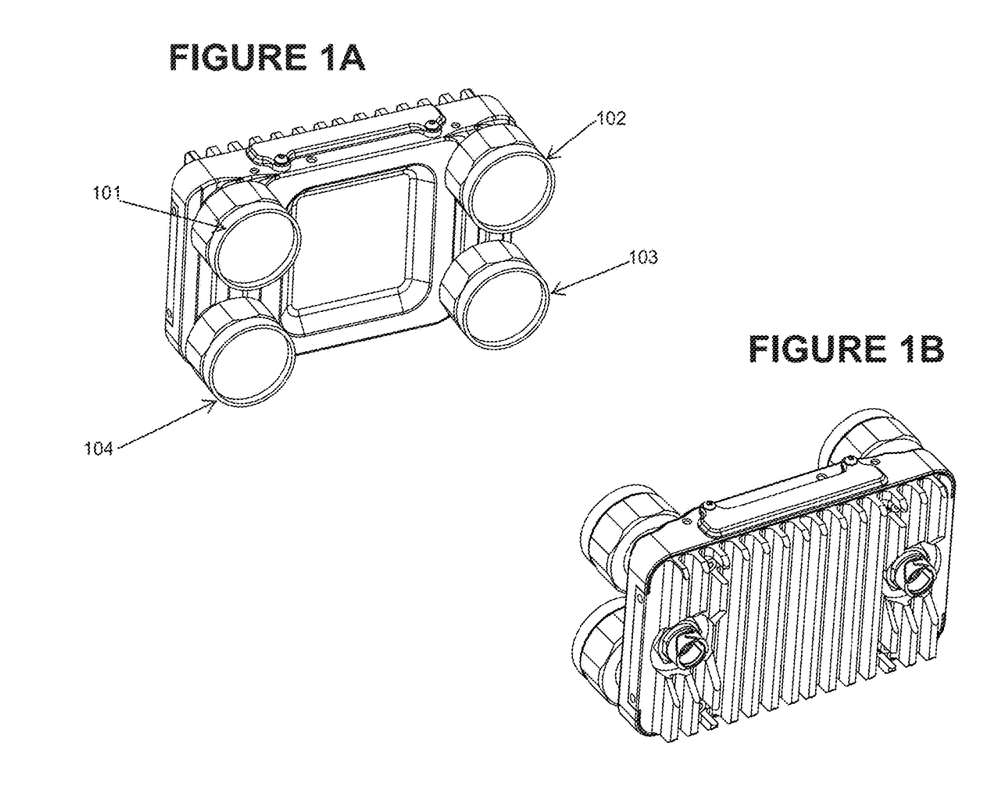
FIG. 1A depicts an example perspective view of the front side of a CV camera unit.
FIG. 1B depicts the back side of the CV camera unit of FIG. 1A.

FIG. 1A depicts an example perspective view of the front side of a CV camera unit. FIG. 1B depicts the back side of the CV camera unit of FIG. 1A.

As can be seen, the example CV camera unit focused upon herein includes at least four image capture assemblies (or ICA's), where an ICA is a combination of an imager chip (e.g., a CCD integrated circuit) and its optical hardware (e.g., a lens assembly). Each ICA (numbered 101-104 in FIG. 1A) is at the vertex of a rectangular configuration.

Figure 2A:
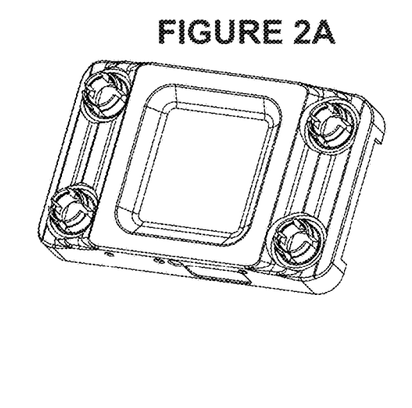
FIG. 2A depicts an example perspective view of just the front plate of the front side of the CV camera of FIG. 1A.

FIG. 2A depicts an example perspective view of just the front plate (and without lens assemblies) of the front side of the CV camera of FIG. 1A. While the front plate varies with respect to its external shape, the material from which the front plate is made is essentially uniform throughout. For example, the front plate of FIG. 2A can be machined, with a CNC milling machine, from a single block of aluminum. Such uniformity is important for maintaining accurate and consistent placing of the ICA's with respect to each other, despite environmental variations (e.g., temperature changes).

Figure 2B:
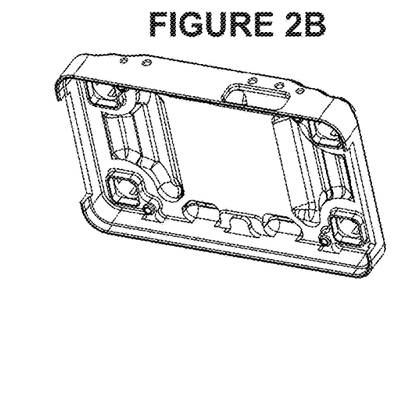
FIG. 2B depicts the same front plate of FIG. 2A, except the surface of the front plate that faces the interior of the CV camera unit is shown

FIG. 2B depicts the same front plate of FIG. 2A, except the surface of the front plate that faces the interior of the CV camera unit is shown.

Figure 3A:
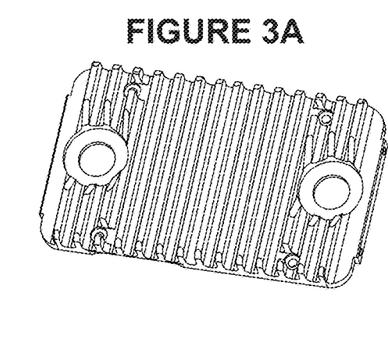
FIGS. 3A and 3B are the same as, respectively, FIGS. 2A and 2B, except they depict an example back plate of the example CV camera unit.
Figure 3B:
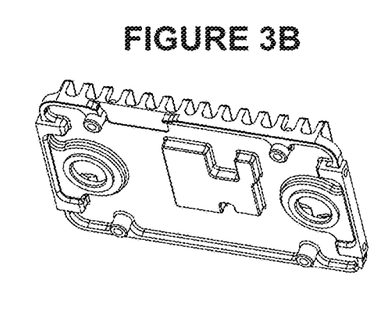

FIGS. 3A and 3B serve the same purposes as, respectively, FIGS. 2A and 2B, except they depict an example back plate of the example CV camera unit.

Figure 4A:
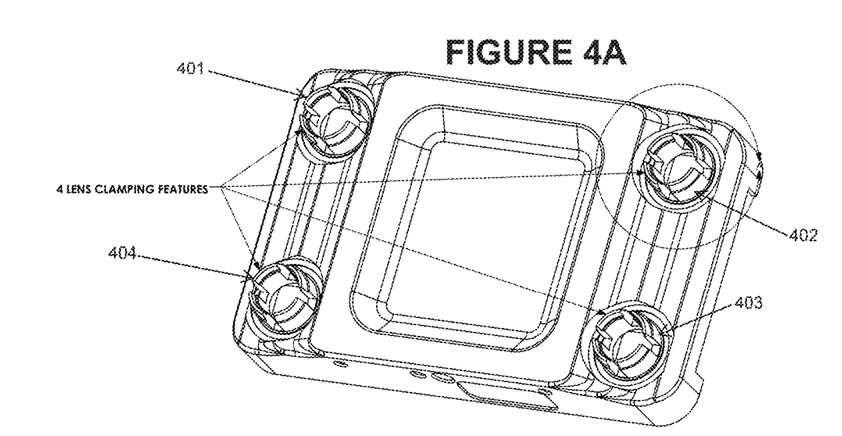
FIG. 4A is the same as FIG. 2A, except it is a magnified view, and the four lens-clamping features are identified.

FIG. 4A is the same as FIG. 2A, except it is a magnified view, and the four structures (numbered 401-404), for lens-assembly clamping, are identified. As part of the construction process, for a CV camera unit, a lens assembly is inserted at each lens-clamping structure. The lens assembly can be of a tubular shape, with threading on its exterior surface. Each lens-clamping structure can also have threading, where the threading matches the exterior-surface threading of a lens assembly.

Figure 4B:
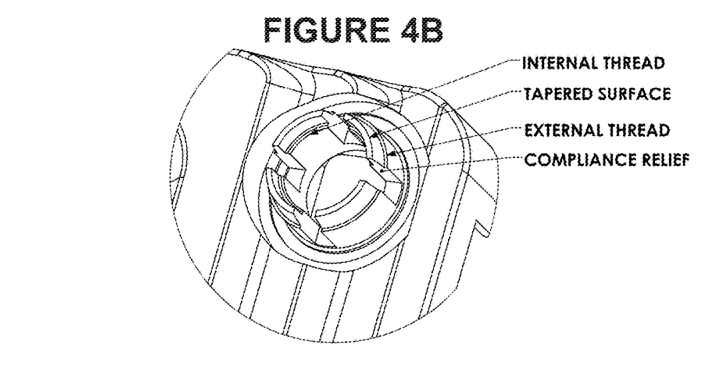
FIG. 4B is the same as FIG. 4A, except it is a further magnified view, that just depicts one of the four lens-clamping features.

FIG. 4B is the same as FIG. 4A, except it is a further magnified view, that just depicts one of the four lens-clamping structures (structure 402). The example lens-clamping structure shown has four lens-clamping "fingers" that, in connection with a clamping nut, tightly, and uniformly, grasp a lens assembly. For the one lens-clamping structure shown in FIG. 4B, 4 key sub-features are identified:

"INTERNAL THREAD" for matching with external threading of a lens assembly.

"TAPERED SURFACE" that causes progressively greater gripping, of a lens assembly, as a clamping nut is progressively tightened.

"EXTERNAL THREAD" for progressively greater tightening of a clamping nut.

"COMPLIANCE RELIEF" locations, that divide a lens-clamping structure into four "fingers."

Figure 5A:
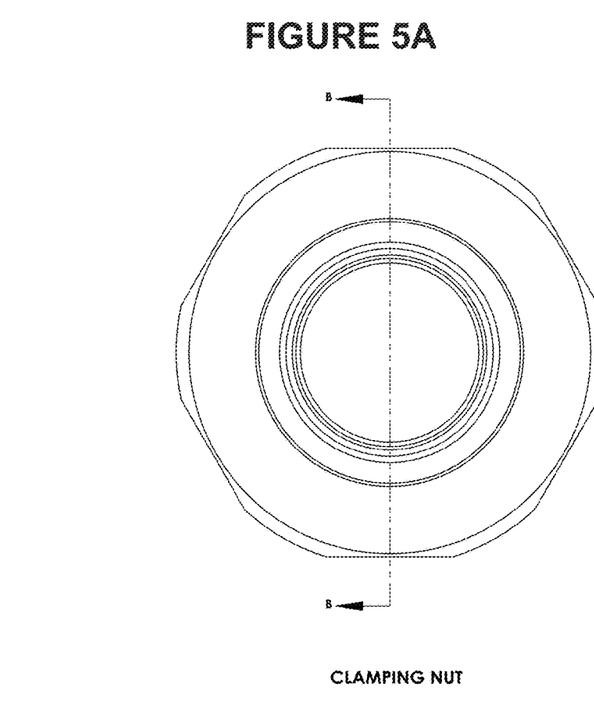
FIGS. 5A and 5B depict, respectively, front and side views of a clamping nut.
Figure 5B:
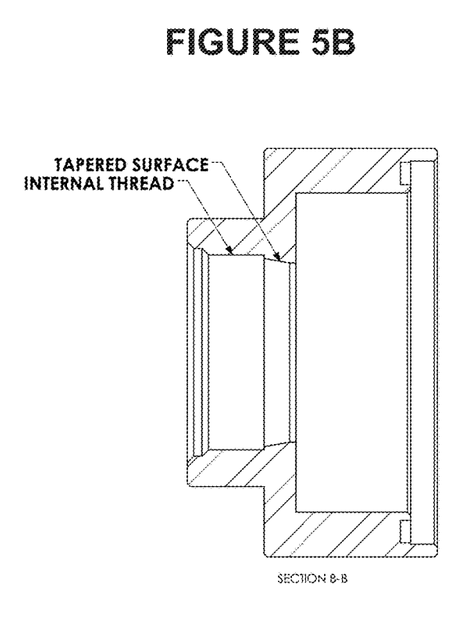

FIGS. 5A and 5B depict, respectively, front and side views of a clamping nut. Once a lens assembly has been inserted, into a lens-clamping structure, it can be tightened in-place with a clamping nut. Specifically, the internal thread of the clamping nut (FIG. 5B) matches with the external thread of a lens-clamping structure (labeled "EXTERNAL THREAD" in FIG. 4B).

In summary, the combination of the clamping fingers, with the clamping nut, achieves a tightened holding, of a lens assembly, with a minimum of additional movement of the lens assembly (relative to the camera unit front plate).

Figure 6:
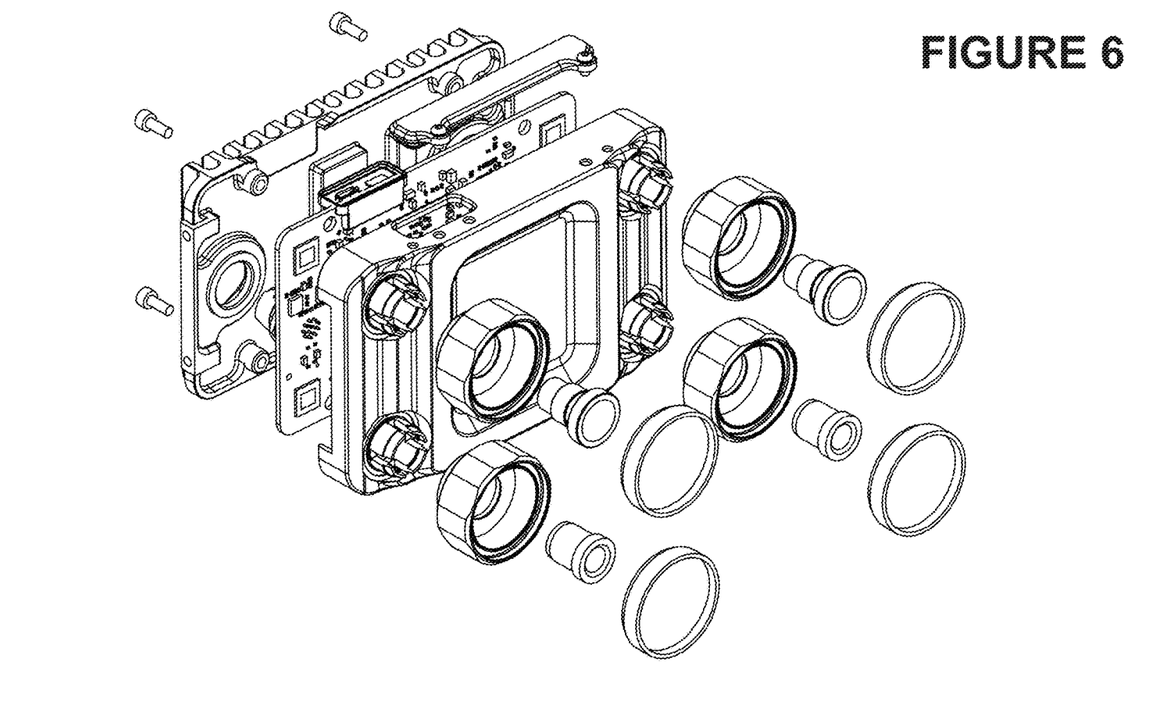
FIG. 6 depicts an exploded view of the CV camera unit, showing how the major components are assembled.

FIG. 6 depicts an exploded view of the CV camera unit, showing how the major components are assembled.

Figure 7A:
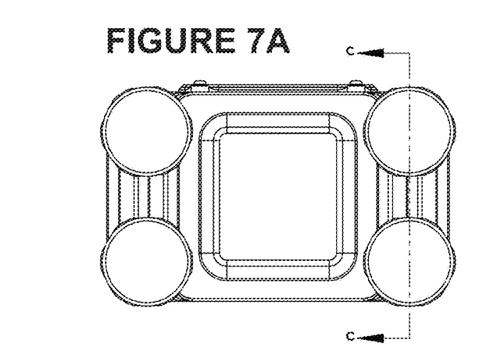
FIG. 7A shows a cut-line "c" of a front view of the CV camera unit.
Figure 7B:
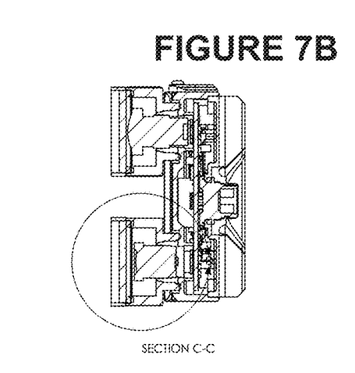
FIGS. 7B-7C show cross sections defined by cut-line "c."
Figure 7C:
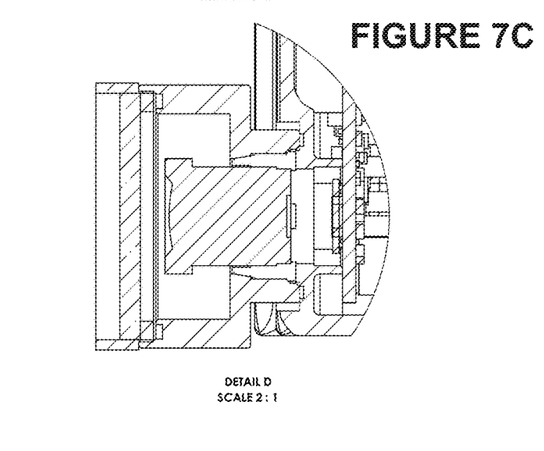

FIG. 7A shows a cut-line "c" for a front view of a CV camera unit. The cross section defined by cut-line "c" is illustrated in FIG. 7B. FIG. 7C depicts a magnified view of a portion of the cross section of FIG. 7B.

Figure 8A:
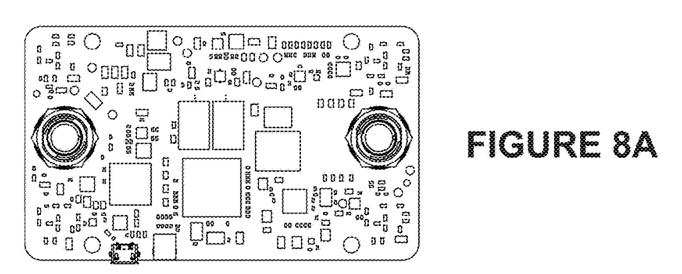
FIGS. 8A-8C show views of a same, single, printed-circuit board (or PCB), on which the electronics of the present CV camera unit can be mounted.
Figure 8B:
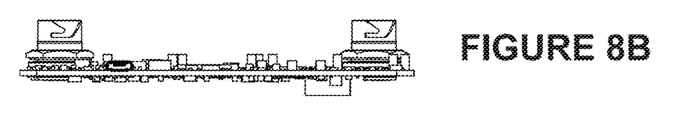
Figure 8C:
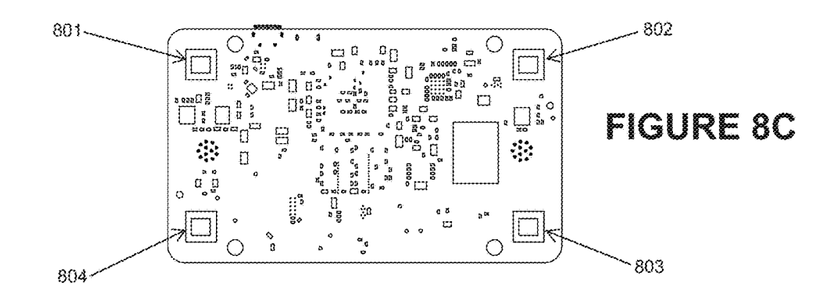

FIGS. 8A-8C show views of a same, single, printed-circuit board (or PCB), on which the electronics of the present CV camera unit can be mounted. FIG. 8A shows the side of the PCB that faces the inside of the back plate of the CV camera unit (i.e., faces the side of the back plate shown in FIG. 3B). FIG. 8B shows a side view of the PCB. FIG. 8C shows the side of the PCB that faces the inside of the front plate of the CV camera unit (i.e., faces the side of the front plate shown in FIG. 2B). At each corner, of the view of the PCB shown in FIG. 8C, is an imager chip (labeled 801-804). Each imager chip 801-804 is part of, respectively, each ICA 101-104 of FIG. 1A.

Mounting all the imager chips on a single PCB, on which is also mounted the high-speed hardware for utilizing the imager chips, has many advantages. First, there is mechanical stability, in the unitary and uniform nature of a single PCB, that is comparable to the stability of lens assemblies and the front plate. Second, high speed cabling and connectors are often quite expensive. Having the imager chips, and the electronics that process their data, on a single PCB, reduces such connector costs to a minimum (while enhancing reliability). Third, the placement of components on PCB's has already been developed to a high level of accuracy (generally, placement is with sub-micron accuracy). This level of placement accuracy, originally developed for non-optical reasons, can now be re-purposed to achieve highly accurate, yet inexpensive, optical assemblies. Further, a single simple alignment between the front plate and PCB, on the basis of mechanical pins and holes, achieves a total accurate alignment of the lens assemblies and their corresponding imager chips.

2 Automatic Alignment

An important feature, of the mechanical construction of the previous section, is that it is designed to limit the possibilities for mis-alignment of the CV camera unit. Specifically, once a CV camera unit has been calibrated at its manufacturing facility, the mechanical construction of the previous section is intended to be extremely stable, despite many environmental stressors.

While extremely stable, the mechanical construction is kept inexpensive, by still utilizing relatively inexpensive lens assemblies. Inexpensive lens assemblies have the characteristic, however, that they can undergo small but chaotic shifts. Specifically, an individual lens can slightly shift, within its mounting, such that the principal point of its containing lens assembly slightly shifts. This slight shift of the principal point means that, for the ICA of which the lens assembly is a part, the principal point is focused on a different photo-sensitive element of its imager chip. A calibration procedure is needed, to identify the photo-sensitive element that has newly become the target of the principal point.

The present section presents an inventive and automatic calibration procedure, for addressing such principal point shifts.

For example, if we have four imagers arranged in rectangular arrangement, because each imager is aligned horizontally and vertically with, respectively, the imager to its left/right and above/below, we can detect misalignment. Also, in many cases, misalignment can be corrected by comparing a set of four images. A minimal amount of re-alignment, that re-establishes consistency across the four images collected, can usually be relied upon as a correct re-alignment.

Figure 9:
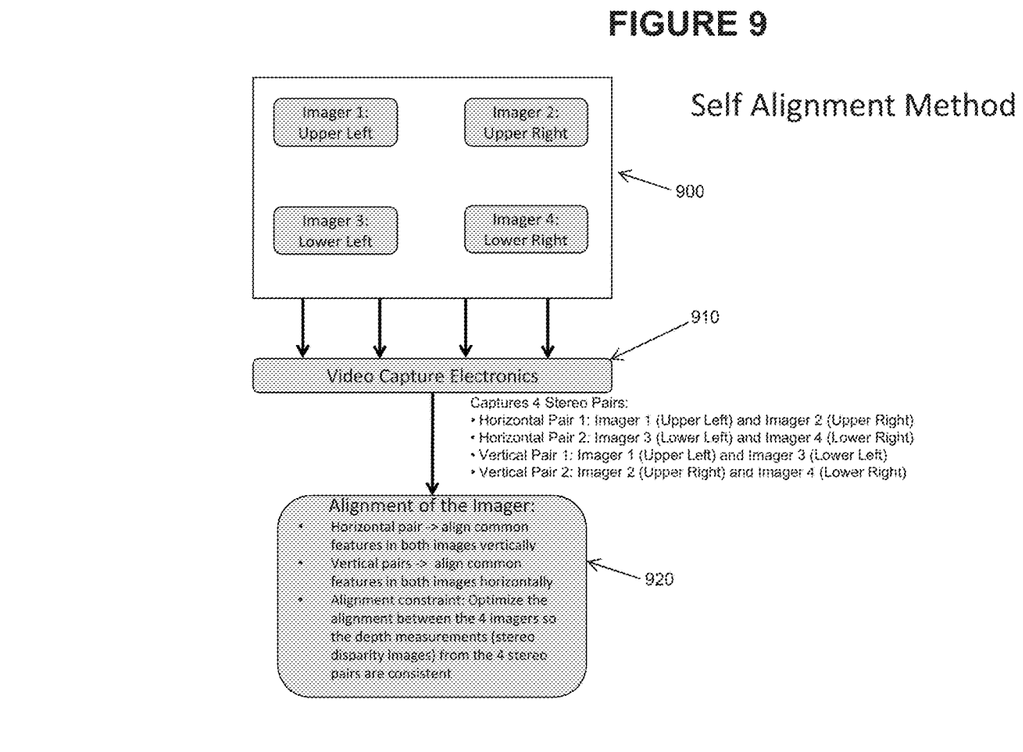
FIG. 9 presents an overview, of the automatic self-alignment apparatus, data flow, and procedure.

FIG. 9 presents an overview, of the automatic self-alignment apparatus, data flow, and procedure:

Box 900 simplifies the physical structure of the CV camera unit to being a frame, into which are embedded, in a rectangular configuration (that includes a square, or any other proportionality) of imager chips.

Box 910 simplifies the video capture electronics to being any suitable combination of components, that is capable of capturing four pairs of images:

Two horizontal pairs, from imagers 1 and 2, and imagers 3 and 4.

Two vertical pairs, from imagers 1 and 3, and imagers 2 and 4.

Box 920, that summarizes the auto-alignment procedure:

The rectangular configuration means that the two horizontal pairs, if calibrated correctly, should measure a same depth to an object, and the two vertical pairs should also (if calibrated correctly) measure a same depth to that object.

The rectangular configuration also means that if a same small feature (small enough for accurate calibration, such as a sharp corner) is identified in all four ICA's, then that feature should appear at a same vertical axis location in both horizontal pairs, and at a same horizontal axis location in both vertical pairs. If the calibration-suitable feature does not appear at a same location, for the horizontal pairs, the vertical pairs, or both, there is an alignment problem.

The alignment problems are fixed by suitable alteration of the principal points, of one or more of the ICA's. A least alteration of the locations of the principal points, that still achieves a correction of alignment issues, is regarded as optimal.

As an additional condition, an alteration of the locations of the principal points must still yield two horizontal pairs and two vertical pairs that all measure a same depth to the calibration-suitable feature.

Box 920 can encompass any suitable computational hardware, whether in integrated circuit form or otherwise. Computational hardware is typically based upon the use of transistors, although other types of components may be included. A programmable memory is intended to include devices that use any kind of physics-based effects or properties, in order to store information in an at least non-transitory way, and for an amount of time commensurate with the application. Unless specifically indicated otherwise, the terms computational hardware, and programmable memory, system, and sub-system, do not include persons, or the mental steps a person may undertake. Further, box 920 can be implemented by hardware, or by any suitable combination of hardware and software, depending upon such factors as desired speed of operation, and cost constraints.

Figure 10A:
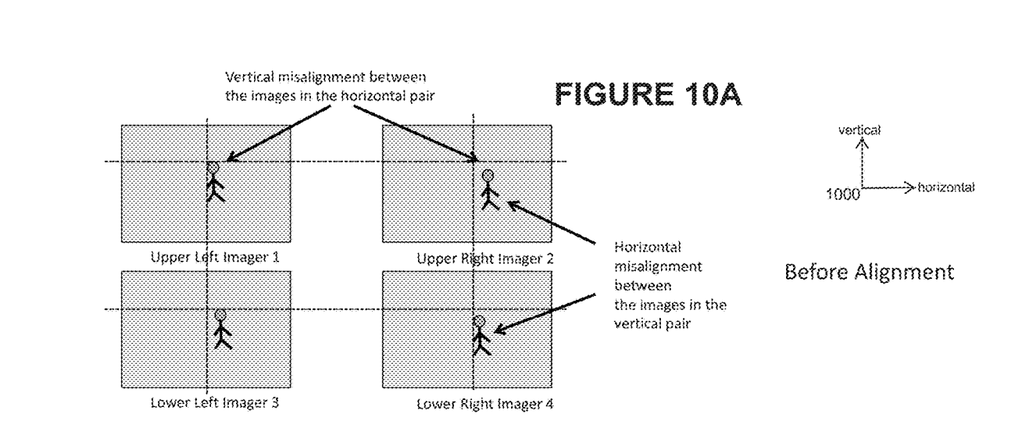
FIGS. 10A and 10B present, respectively, views that show "before" and "after" a self-alignment procedure has been applied.
Figure 10B:
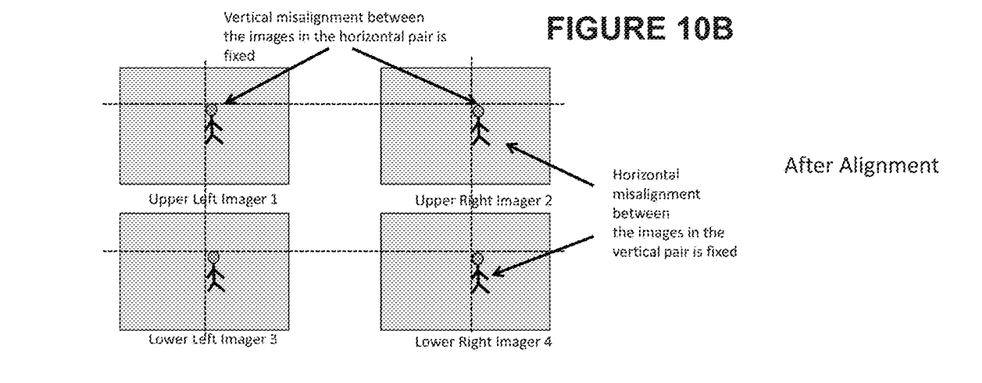

FIGS. 10A and 10B present, respectively, views that show "before" and "after" a self-alignment procedure has been applied. Specifically, the "before" situation of FIG. 10A is as follows (see axes 1000, of FIG. 10A, defining vertical and horizontal):

vertical misalignment of the two pairs of horizontally-spaced image chips:
  Between image chips 1 and 2: head of stick figure is lower in image from imager 2 compared with image from imager 1.
  Between image chips 3 and 4: head of stick figure is lower in image from imager 4 compared with image from imager 3.
horizontal misalignment of the two pairs of vertically-spaced image chips:
  Between image chips 1 and 3: head of stick figure in lower image, from imager 3, is located to the right of head of stick figure in image from imager 1.
  Between image chips 2 and 4: head of stick figure in upper image, from imager 2, is located to the right of head of stick figure in image from imager 4.
In contrast, in FIG. 10B:
No vertical misalignment of the two pairs of horizontally-spaced image chips:
  Between image chips 1 and 2: head of stick figure at same vertical location in images from both imagers.
  Between image chips 3 and 4: head of stick figure at same vertical location in images from both imagers.
No horizontal misalignment of the two pairs of vertically-spaced image chips:
  Between image chips 1 and 3: head of stick figure at same horizontal location in images from both imagers.
  Between image chips 2 and 4: head of stick figure at same horizontal location in images from both imagers.

What is not shown, between FIGS. 10A and 10B, is the extent to which the principal point has been adjusted, with respect to each of image chips 1, 2, 3, and 4, in order to achieve the alignment of FIG. 10B.

In order to discuss this, it will be useful to introduce some background notation, as well as a more specific example.

Let us refer to the initially calibrated principal points, for image chips 1, 2, 3, and 4, as, respectively, $(Xc1, Yc1)$, $(Xc2, Yc2)$, $(Xc3, Yc3)$, and $(Xc4, Yc4)$.

To take a specific example, consider a situation where each imager chip is 801 pixels wide (x-axis) and 601 pixels high (y-axis). Assuming perfect alignment, between the lens assembly and imager chip of an ICA, the principal point would be focused on the imaging element at location $x=401$ and $y=301$. But due to such factors as lens imperfections, and variations in assembly, the principal point is likely to be focused on an imaging element that is slightly different. For example, the principal point for image chip 1 might be focused on the imaging element at $x=401$ and $y=298$. In that case, using the above notation, the calibrated principal point, for image chip 1, would be $(Xc1=401, Yc1=298)$.

Due to a variety of factors, such as any combination of vibration, shock, or temperature fluctuation, the principal point of each ICA can move from its calibrated values. For a well-designed camera and lens, this movement is usually limited to a number of pixels that is a small percentage of the total pixels in either direction. For example, for the above example of an 801×601 imager, a movement of 3 pixels represents just a 0.4% movement along the 801 pixel dimension and a 0.5% movement along the 601 pixel dimension. Even a movement of tens of pixels represents a small percentage, that can be accommodated by the auto-alignment invention. For example, a movement of 30 pixels still only represents, with respect to an 801×601 imager, movements of, respectively, 4% and 5%. For an imager with super high resolution, such as having a width of 5000 image elements, a variation accommodated by the present invention can reach a few hundred pixels (e.g., 4% of 5000 is 200 pixels).

For a calibration-suitable feature "f," it's location in an image chip "i" can be expressed as $(Xfi, Yfi)$. The location of this common feature, across all four image chips of a rectangular configuration, can be expressed as: $(Xf1, Yf1)$, $(Xf2, Yf2)$, $(Xf3, Yf3)$, and $(Xf4, Yf4)$.

Measuring the horizontal disparity of feature "f," across image chips 1 and 2 for purposes of depth determination, represents the difference in the horizontal (or "X") location of the feature between the two image-element arrays: $Xf1-Xf2$. This horizontal disparity can be relied upon, so long as we know that "f," because it is a common small feature, must be treated as aligned vertically (i.e., $Yf1=Yf2$). Measuring disparity across image chips 3 and 4 must work the same way, except chip 3 substitutes for chip 1 and chip 4 substitutes for chip 2.

Measuring the vertical disparity of feature "f," across image chips 1 and 3 for purposes of depth determination, represents the difference in the vertical (or "Y") location of the feature between the two image-element arrays: $Yf1-Yf3$. This vertical disparity can be relied upon, so long as we know that "f," because it is a common small feature, must be treated as aligned horizontally (i.e., $Xf1=Xf3$). Measuring disparity across image chips 2 and 4 must work the same way, except chip 2 substitutes for chip 1 and chip 4 substitutes for chip 3.

Auto-alignment consists of selecting new locations, for principal points $(Xc1, Yc1)$, $(Xc2, Yc2)$, $(Xc3, Yc3)$, and $(Xc4, Yc4)$, such that any mis-alignment, for a calibration-suitable feature, is corrected. These new locations for the principal points, for image chips 1, 2, 3, and 4, can be expressed, respectively, as follows: (Xn1, Yn1), (Xn2, Yn2), (Xn3, Yn3), and (Xn4, Yn4).

Figure 11A:
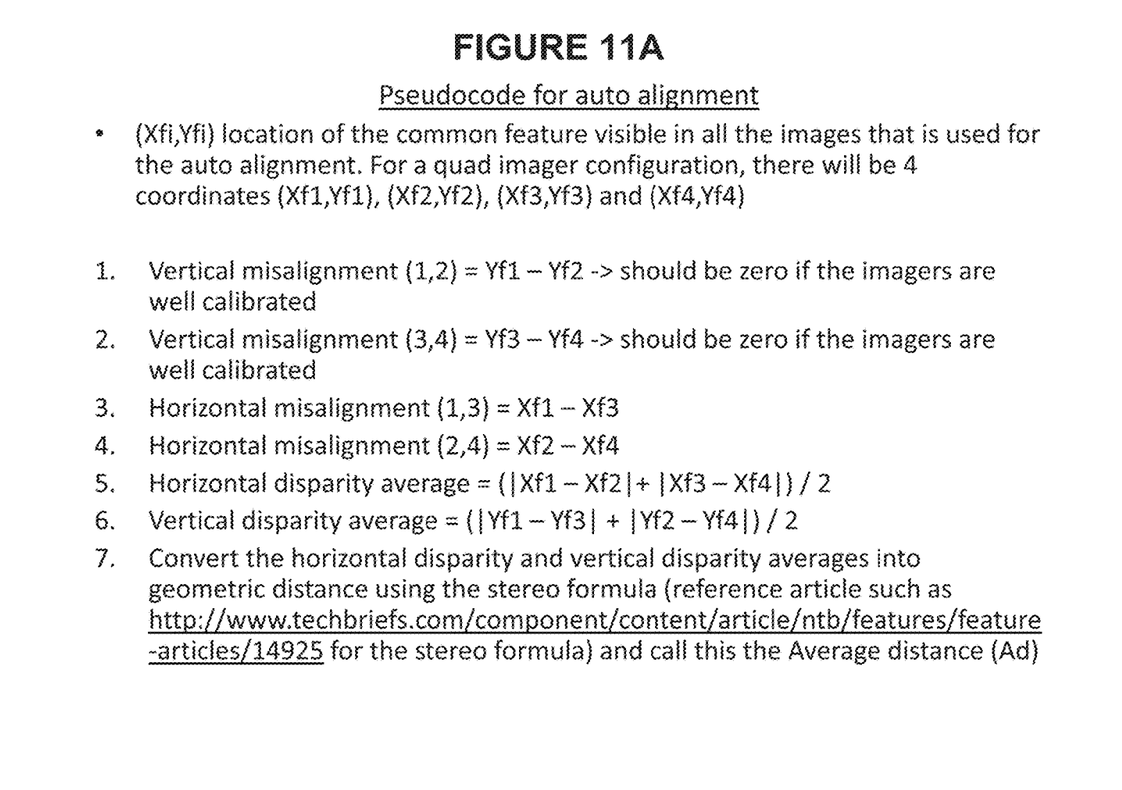
FIGS. 11A-11B present example pseudo-code, by which self-alignment can be accomplished.
Figure 11B:
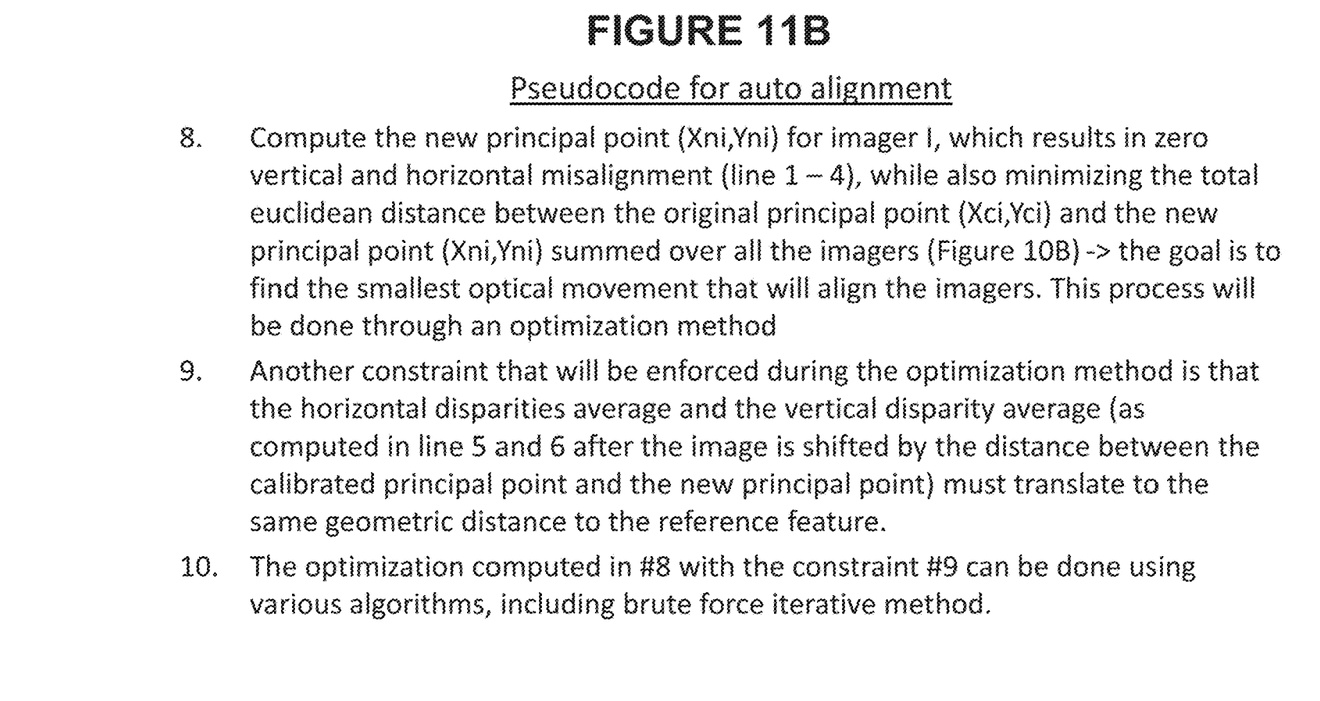

Given this background, FIGS. 11A-11B present an example pseudo-coded procedure, by which self-alignment in accordance with the present invention can be accomplished. A step-by-step commentary, on the pseudo-code, follows:

1. Vertical misalignment, if any, between image chips 1 and 2 is tested for, with respect to a common calibration-suitable feature.
2. Vertical misalignment, if any, between image chips 3 and 4 is tested for, with respect to a common calibration-suitable feature.
3. Horizontal misalignment, if any, between image chips 1 and 3 is tested for, with respect to a common calibration-suitable feature.
4. Horizontal misalignment, if any, between image chips 2 and 4 is tested for, with respect to a common calibration-suitable feature.
5. Under one version of this procedure, an average of the horizontal disparities, of the two horizontal pairs (for a four-camera rectangular CV camera unit), is determined.
6. Under one version of this procedure, an average of the vertical disparities, of the two vertical pairs (for a four-camera rectangular CV camera unit), is determined.
7. Using standard stereo vision techniques, horizontal and vertical disparities can each be converted into a depth to the detected feature "f."
8. If vertical misalignment, horizontal misalignment, or both, are detected, a search is performed for an alteration, of one or more of the principal points, that results in elimination of the misalignments. The goal is that the net Euclidean distance, by which the principal points need to be moved, is minimized.
9. A set of adjustments, to principal point locations, cannot change the fact that the horizontal camera pairs must still measure a same depth to a feature "f" as the vertical camera pairs. With respect to this step, an average of the distances measured by the horizontal camera pairs (as described in step 5 of the pseudo-code) can be compared with an average of the distances measured by the vertical camera pairs (as described in step 6 of the pseudo-code). Alternatively, the distance measured by one of the adjusted horizontal pairs can be compared with the distance measured by one of the adjusted vertical pairs.
10. Candidate sets, of adjustments to principal point locations, can be generated by any suitable optimization technique. This can include simple non-heuristically guided approaches, approaches that utilize heuristics, and the utilization of stochastic techniques.

3 Foveal and Peripheral Vision Emulation

An important use, of being able to simultaneously operate at least two stereo-vision pairs, is to operate a first stereo-vision pair with a first field of view that is broader than, and contains, a second field of view of a second stereo-vision pair.

In this case, the first and second stereo-vision pairs can be regarded as emulating, respectively, human peripheral and foveal vision.

For example, the second field of view can be approximately centered within the first field of view. In terms of a ratio of the areas, between the first and second fields of view, an example is 2:1 (i.e., the first field of view encompasses approximately 2× the area of the second field of view). In this case, assume the first pair of ICA's, that captures the first field of view, uses the same imager chip as the second pair of ICA's, that captures the second field of view. In this case, a same number of photo-electric elements is used to capture the first and second fields of view, with the result that the density, of photo-electric elements per unit area, is 2× higher for the second field of view compared with the first field of view.

In keeping with the use of "f-numbers" (or "f-stops"), in the field of photography, other suitable ratios of the areas, between the first and second fields of view, can include the following: 4:1, 8:1, 16:1, 32:1, etc.

In general, it can be expected that the ratio of the areas, between the first and second fields of view, can be somewhere within the range of 2:1 to 100:1.

The first (or peripheral) field of view, because it collects light from a larger area of the external scene, can be better at collecting image information in lower-light environments (e.g., at night), compared with the second (or foveal) field of view.

The light collecting advantage of the peripheral field of view can be further enhanced by using a monochromatic matrix of photo-electric elements for its imager chip, compared with a color-sensitive matrix of photo-electric elements for the imager chip of the foveal field of view. (Conversely, to compensate for its lower light-gathering capacity, the foveal field of view can be equipped with a monochromatic imager chip, while the peripheral field of view has a color-sensitive matrix of photo-electric elements.)

Also, because the peripheral field of view collects light from a larger area, it can be better (compared to the foveal field of view) at detecting, and tracking, the motion of objects in the external scene. Conversely, because the foveal field of view collects light from a smaller area it can be better (compared to the peripheral field of view) at capturing detail in the external scene.

The motion detecting, and tracking, capability of the peripheral field of view can be further enhanced by collection of image-pairs at a higher rate (also known as a higher "frame rate"), compared to the foveal field of view. The greater amount of data generated, as a result of a higher frame rate, can be at least partially compensated by using a monochromatic matrix of photo-electric elements for the peripheral field of view, compared with a color-sensitive matrix of photo-electric elements for the foveal field of view.

4 Versatility

Simultaneous operation of at least two stereo-vision pairs can be useful even if their fields of view are not arranged to emulate peripheral and foveal vision.

For example, even if the first and second stereo-vision pairs have essentially identical fields of view, they can be used to achieve a net CV camera unit with extremely high dynamic range.

For example, the first stereo-vision pair can be adjusted to handle, relative to the second stereo-vision pair, low light situations. This can be achieved, for example, by having the first stereo-vision pair operate with a much longer exposure time, per frame of video data collected, than the second stereo-vision pair.

In other words, for each frame of stereo-vision data collected, the first stereo-vision pair provides a much longer time period in which photons are collected. Therefore, conversely, the second stereo-vision pair is better at handling (at least relative to the first stereo-vision pair) high light situations.

This type of light-intensity specialization, between the first and second stereo-vision pairs, can be useful in many outdoor situations. With a mobile CV system, certain parts of a scene may be in shadow, while other parts are simultaneously in bright sunlight.

In general, a great deal of versatility can be achieved, by varying the frame rate, exposure time, or both, of two or more simultaneously operating stereo-vision pairs.

5 Glossary of Selected Terms

ICA: an Image Capture Assembly, comprising a combination of an imager chip and its lens assembly.

Imager chip: an integrated circuit provided with an array of electrically-readable photo-sensitive elements.

Lens assembly: an assembly of one or more lenses, with a mechanical structure for holding the lenses.

While the invention has been described in conjunction with specific embodiments, it is evident that many alternatives, modifications and variations will be apparent in light of the foregoing description. Accordingly, the invention is intended to embrace all such alternatives, modifications and variations as fall within the spirit and scope of the appended claims and equivalents.

What is claimed is:

1. A method for a first computer vision camera unit, comprising:
   identifying a same first feature with first, second, third, and fourth image capture assemblies, each image capture assembly having a lens assembly embedded, in a first frame, at a vertex of a first rectangular configuration;
   identifying, with first, second, third, and fourth imager chips, of, respectively, the first, second, third, and fourth image capture assemblies, the same first feature as being at first, second, third, and fourth locations, relative to, respectively, first, second, third, and fourth principal points;
   determining, performed at least in part with a configuration of computing hardware and programmable memory, if, with respect to a first axis, there is a first misalignment between the first and second locations;
   determining, performed at least in part with a configuration of computing hardware and programmable memory, if there is the first misalignment, a first change, for each of the first and second principal points, that reduces the misalignment to zero;
   determining, performed at least in part with a configuration of computing hardware and programmable memory, if, with respect to the first axis, there is second misalignment between the third and fourth locations;
   determining, performed at least in part with a configuration of computing hardware and programmable memory, if there is a second misalignment, a second change, for each of the third and fourth principal points, that reduces the misalignment to zero;
   determining, performed at least in part with a configuration of computing hardware and programmable memory, if, with respect to a second axis, there is third misalignment between the first and third locations;
   determining, performed at least in part with a configuration of computing hardware and programmable memory, if there is a third misalignment, a third change, for each of the first and third principal points, that reduces the misalignment to zero;
   determining, performed at least in part with a configuration of computing hardware and programmable memory, if, with respect to the second axis, there is a fourth misalignment between the second and fourth locations;
   determining, performed at least in part with a configuration of computing hardware and programmable memory, if there is a fourth misalignment, a fourth change, for each of the second and fourth principal points, that reduces the misalignment to zero;
   determining, performed at least in part with a configuration of computing hardware and programmable memory, as a result of the first and third changes, a first distance by which the first principal point changes its location;
   determining, performed at least in part with a configuration of computing hardware and programmable memory, as a result of the first and fourth changes, a second distance by which the second principal point changes its location;
   determining, performed at least in part with a configuration of computing hardware and programmable memory, as a result of the second and third changes, a third distance by which the third principal point changes its location;
   determining, performed at least in part with a configuration of computing hardware and programmable memory, as a result of the second and fourth changes, a fourth distance by which the fourth principal point changes its location;
   determining, performed at least in part with a configuration of computing hardware and programmable memory, the first, second, third, and fourth changes such that a sum, of first, second, third, and fourth distances, is minimized;
   determining, performed at least in part with a configuration of computing hardware and programmable memory, a first depth, of the first feature from the first computer vision camera unit, based upon a change of location of the first feature, along the second axis, between the first and second locations;
   determining, performed at least in part with a configuration of computing hardware and programmable memory, a second depth, of the first feature from the first computer vision camera unit, based upon a change of location of the first feature, along the first axis, between the first and third locations; and
   rejecting, performed at least in part with a configuration of computing hardware and programmable memory, a set, of first, second, third, and fourth changes, if the first depth does not equal the second depth.

2. A method for a first computer vision camera unit, comprising:
   capturing a first pair of images, for use with stereo depth perception, from a first pair of image capture assemblies oriented according to a first axis and optically focused to capture a first field of view;
   capturing a second pair of images, for use with stereo depth perception, from a second pair of image capture assemblies oriented according to the first axis and optically focused to capture a second field of view;

wherein the first and second fields of view are optically focused to overlap;

wherein the first and second fields of view are optically focused such that the second field of view is within the first field of view;

capturing the first pair of images with a first pair of imager chips with a first density of photo-sensitive elements;

capturing the second pair of images with a second pair of imager chips with a second density of photo-sensitive elements; and wherein the first and second densities are different and are selected such that a second resolution, of the second pair of images, is greater than a first resolution of the first pair of images.

3. A method for a first computer vision camera unit comprising:

capturing a first pair of images, for use with stereo depth perception, from a first pair of image capture assemblies oriented according to a first axis and optically focused to capture a first field of view;

capturing a second pair of images, for use with stereo depth perception, from a second pair of image capture assemblies oriented according to the first axis and optically focused to capture a second field of view;

wherein the first and second fields of view are optically focused to overlap;

wherein the first and second fields of view are optically focused such that the second field of view is smaller than the first field of view;

capturing the first pair of images with a first pair of imager chips;

capturing the second pair of images with a second pair of imager chips;

capturing at a first rate, with the first pair of imager chips, a first series of pairs of images;

capturing at a second rate, with the second pair of imager chips, a second series of pairs of images; and wherein the first rate is higher than the second rate.

4. The method of claim 3, wherein the first rate is selected to better capture motion while the second rate is chosen to better capture detail.

5. The method of claim 3, wherein the first series, of pairs of images, is captured as monochrome, while the second series, of pairs of images, includes a capture of color.

6. A method for a first computer vision camera unit, comprising:

capturing a first pair of images, for use with stereo depth perception, from a first pair of image capture assemblies oriented according to a first axis and optically focused to capture a first field of view;

capturing a second pair of images, for use with stereo depth perception, from a second pair of image capture assemblies oriented according to the first axis and optically focused to capture a second field of view;

wherein the first and second fields of view are optically focused to overlap;

capturing the first pair of images with a first pair of imager chips with a first level of light sensitivity for its photo-sensitive elements;

capturing the second pair of images with a second pair of imager chips with a second level of light sensitivity for its photo-sensitive elements; and wherein the first and second light sensitivity levels are selected to be substantially different from each other.

7. The method of claim 6, wherein the first and second light sensitivity levels are selected to provide the first computer vision camera unit with a high dynamic range.

8. The method of claim 1, wherein the first, second, third, and fourth changes are determined, for minimization of their sum, by a non-heuristic iterative method.

9. The method of claim 1, wherein the first, second, third, and fourth changes are determined, for minimization of their sum, by an at least partially stochastic method.

10. The method of claim 2, wherein the first and second pairs of image capture assemblies form a rectangular configuration.

11. The method of claim 3, wherein the first and second pairs of image capture assemblies form a rectangular configuration.

12. The method of claim 6, wherein the first and second pairs of image capture assemblies form a rectangular configuration.

* * * * *